United States Patent [19]

Goodwin et al.

[11] Patent Number: 4,874,464
[45] Date of Patent: Oct. 17, 1989

[54] PROCESS FOR EPITAXIAL DEPOSITION OF SILICON

[75] Inventors: Dennis L. Goodwin, Tempe; Mark R. Hawkins, Mesa; Wayne L. Johnson, Phoenix; Aage Olsen, Chandler; McDonald Robinson, Paradise Valley, all of Ariz.

[73] Assignee: Epsilon Limited Partnership, Tempe, Ariz.

[21] Appl. No.: 167,347

[22] Filed: Mar. 14, 1988

[51] Int. Cl.[4] .................. H01L 21/306; H01L 21/205; C03B 23/00; B44C 1/22
[52] U.S. Cl. .................... 156/646; 156/612; 156/613; 156/650; 156/654; 156/657; 156/662; 427/255.2; 437/85
[58] Field of Search .............. 156/610, 612, 613, 646, 156/650, 654, 657, 662; 131/1, 30, 31; 427/248.1, 255.2, 294; 437/81, 83, 85, 87, 108; 252/79.1, 79.2

[56] References Cited

U.S. PATENT DOCUMENTS 3,473,978 10/1969 Jackson et al. .............. 427/255.2 X
4,138,306 2/1979 Niwa ................................ 156/345

Primary Examiner—William A. Powell
Attorney, Agent, or Firm—Harry M. Weiss & Associates

[57] ABSTRACT

The present invention relates to a high throughput single crystal epitaxial deposition process which achieves increased uniformity, both wafer to wafer and across the wafer surface. There is provided an epitaxial deposition process characterized by low-level cooling periods which minimize temperature changes between deposition cycles and inter-cycle cleaning so that each new wafer is presented with a substantially equivalent deposition environment.

21 Claims, 1 Drawing Sheet

PROCESS FOR EPITAXIAL DEPOSITION OF SILICON

RELATED APPLICATIONS

This invention relates to the epitaxial deposition reactor disclosed in a co-pending patent application filed Oct. 15, 1987 as Ser. No. 108,771 by R. Crabb et al, entitled "Chemical Vapor Deposition System", U.S. Pat. No. 4828224 and a co-pending patent application filed June 24, 1987 as Ser. No. 065,945 by Albert Ozias, entitled "Improved Reaction Chamber for Chemical Vapor Deposition Systems, each of which are incorporated herein by reference thereto.

BACKGROUND OF THE INVENTION

According to the present invention there is provided a process for epitaxial deposition of silicon. More particularly, the present invention relates to a high throughput single crystal epitaxial deposition process which achieves increased uniformity, both wafer to wafer and across the wafer surface.

Conventional epitaxial processes are characterized by cycle times on the order of 30–60 minutes. As illustrated by U.S. Pat. No. 3,177,100 entitled "Depositing Epitaxial Layer of Silicon from a vapor mixture of SiH4 and H2" issued to A. Mayer et al, the lengthy cycle time of conventional processes is due, in principal, to the need for protracted cooling prior to removal of the wafer after the deposition reaction. Further delay is occasioned by the consequent requirement of re-heating the susceptor to initiate the subsequent deposition cycle. Repetitive changes in the temperature of the susceptor between each cycle result from the need to cool the susceptor prior to removal from the reaction chamber. It is well known that these temperature changes impart physical stresses which devitrify the crystal lattice in both the susceptor and the substrate. Discontinuities and flaking may also result and further interfere with achieving uniform deposition.

Throughput is, of course, limited by the long cycle times. Because the conventional processes are plagued by low throughput and long cycle times, reactor cleaning is performed only after the deposition runs are complete and the reactor may be taken out of service.

Epitaxial layers on semiconductor wafers have been fabricated by forming a halogen compound of the semiconductor, such as germanium, silicon, or the like, then passing its vapors into a reaction chamber and reducing the halogen with hydrogen. As illustrated in U.S. Pat. No. 3,177,100, conventional processes position the wafer on a susceptor within the reaction vessel; after evacuation, the reaction chamber is purged with hydrogen and the susceptor and wafer are heated to about 1200° C. by rf induction. This temperature is maintained for about fifteen minutes in the flowing hydrogen ambient to clean the wafer surface of any residual oxides. Electrical power to the rf coil is then reduces, thereby reducing the temperature of the wafer and susceptor to within the range of about 1000° C. to 1150° C. Silane, SiH4, mixed with hydrogen is then introduced into the reaction chamber. Decomposition of silane in accordance with the equation:

which deposits an epitaxial layer of silicon on the wafer. The rate of deposition depends, of course, upon the concentration of silane in the reaction vessel and the temperature of the susceptor. Since the deposition rate is temperature dependant, it is important that the wafer be exposed to substantially uniform temperature profile during the deposition run. N or P doping of the silicon may be achieved by incorporating the dopant into the reactant gas flow.

Alternative conventional processes are described E. O. Ernst et al in U.S. Pat. No. 3,424,629 entitled "High Capacity Epitaxial Apparatus and Method" and by V. Y. Doo and E. O. Ernst in "A Survey of Epitaxial Growth Processes and Equipment," *SCP and SOLID STATE TECHNOLOGY*, October, 1967, pp 31–39. One alternative process utilizes silicon tetrachloride, SiCl4, as the reactant species in a hydrogen flow. Silicon tetrachloride decomposes according to the following reaction:

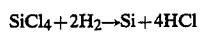

which may produce side reaction products depending upon reactant concentration, temperature, pressure and reactor geometry. This process is characterized by virtually identical time, temperature and pressure profiles as the reaction process with silane.

A summary of the deposition run cycle is provided in U.S. Pat. No. 3,424,629 as follows:

(1) Wafers loaded into the reaction chamber;
(2) Argon purge at 10 standard liters/minute (slm) for 9 minutes (min.);
(3) Hydrogen purge at 25 slm for 10 min.;
(4) Rf heating of susceptor to 1200° C.;
(5) Hydrogen etch for 15 min. to remove oxides;
(6) Silicon deposition for 6–14 min., depending upon thickness specification at a deposition rate of 0.8 /min.
(7) Maintain wafer temperature at 1200° C. for 3 min.
(8) Hydrogen purge;
(9) Cool wafers in hydrogen for 10 min.;
(10) Cool wafers in argon unitl wafers reach room temperature for handling;
(11) Remove wafers from reactor.

The total running time for a typical run was seventy-five minutes. Other reactant species, such as SiHCl3, SiCl2 or similar halogenated silicon compounds, may be employed.

It will, therefore, be appreciated by those skilled in the art that protracted deposition run cycle times are characteristic of the conventional epitaxial deposition processes. Factors contributing to the long cycle times include the need to cool the wafers to room temperature prior to handling and the corresponding need to re-heat the reaction chamber for a subsequent deposition run.

Thus, it has been found that a new process was required to alleviate these limitations of the conventional processes. According to the present invention, there is provided an epitaxial deposition process characterized by low-level cooling periods which minimize temperature changes between deposition cycles and inter-cycle cleaning so that each new wafer is presented with a substantially equivalent deposition environment. By limiting the need for lengthy cool down, providing for inter-cycle cleaning and modulating gas usage, the process of the present invention achieves higher single crystal epi growth rates that the conventional processes. The single crystal produced thereby is characterized by a more uniform crystal lattice in each wafer and wafer-to-wafer.

SUMMARY OF THE INVENTION

Thus, it is an object of the present invention to provide a process for epitaxial deposition of silicon which results in shorter deposition cycle times that the conventional processes.

It is a further object of the present invention to provide a process for epitaxial deposition of silicon which reduces temperature changes in the susceptor and in the wafer during the cool down period prior to removal from the reactor.

It is still a further object of the present invention to provide a process for epitaxial deposition of silicon which employs inter-cycle reactor cleaning.

It is another further object of the present invention to provide a process for epitaxial deposition of silicon which achieves higher growth rates than that achieved by the conventional processes.

These and other objects hereinafter disclosed will become more apparent to those skilled in the art from the following more detailed description of the preferred embodiment of the present invention. In the accompanying drawings like features are identified by like reference numerals.

DETAILED DESCRIPTION OF THE PREFERRED EMBODIMENT

Figure 1:
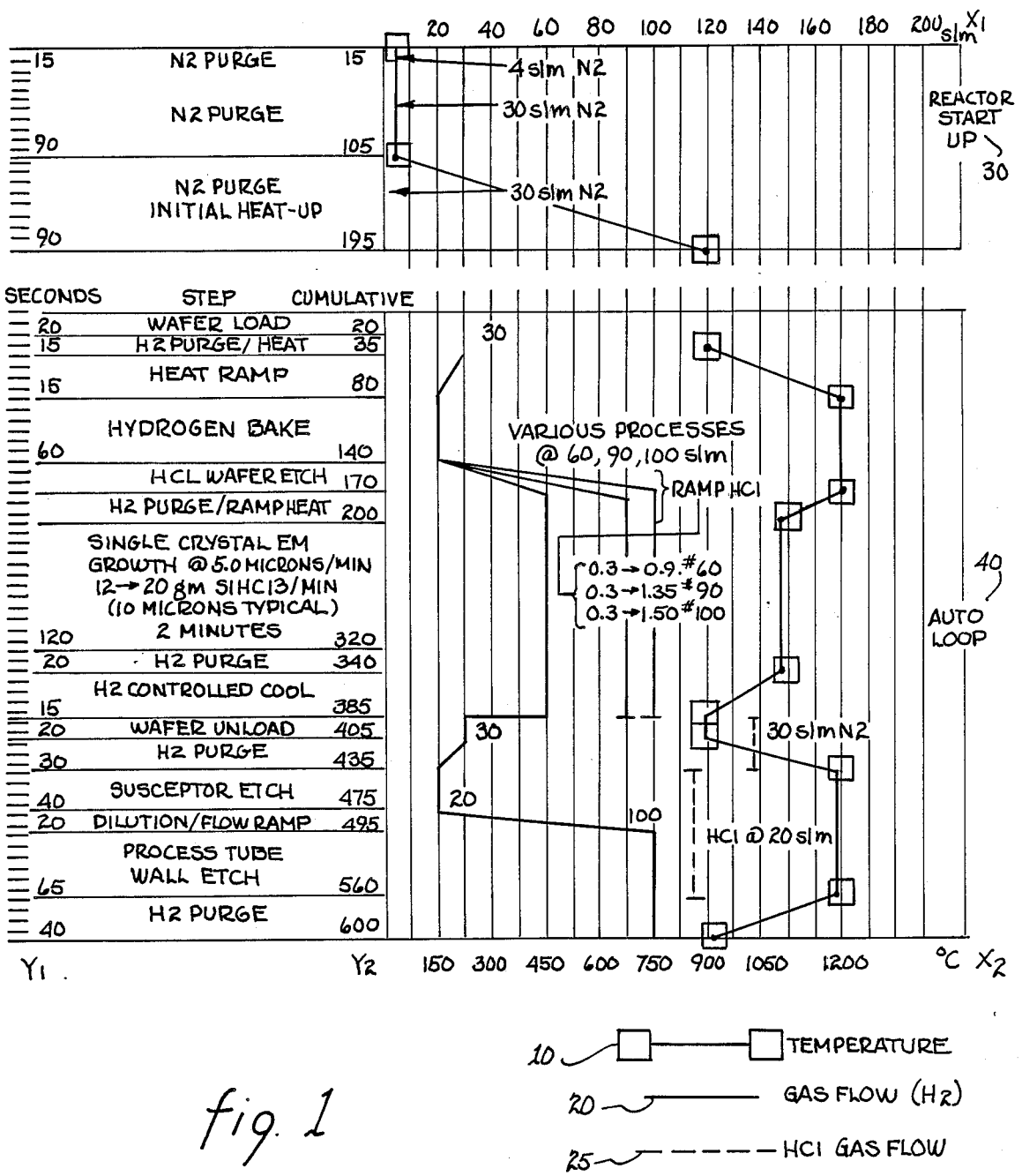
FIG. 1 is a process flow diagram of the deposition process cycle of the present invention, showing on an $X_1$-axis thereof the step time, on an $X_2$-axis thereof the cumulative cycle time, on the $Y_1$-axis thereof showing gas usage and on the $Y_2$-axis thereof showing temperature.

According to the present invention there is provided an epitaxial deposition process for making semiconductor wafers. The present process relates to a single-wafer process which exposes each wafer to substantially identical reaction environments run to run. After deposition in a reactor such as that disclosed in the co-pending applications by R. Crabb et al, Ser. No. 108,771, and Albert Ozias, Ser. No. 065,945, a controlled low-grade cooling of the reaction chamber is conducted and the reacted wafer removed. After removal of the reacted wafer from the susceptor and the reaction chamber it is transferred to an interlock for cooling in a non-oxidizing environment of nitrogen or hydrogen. While the reacted wafer is cooling, the epi reactor is re-heated for a susceptor etch and a subsequent chamber etch. After cleaning the susceptor and chamber, the reaction chamber is again subjected to a low-grade cooling for loading of another wafer for a subsequent deposition run.

This process permits both unloading and loading of wafers while the reaction chamber and susceptor are at an elevated temperature. Introduction of the wafer into the heated reaction chamber minimizes the power required to elevate the chamber to deposition temperatures. Unloading of the wafers at an elevated temperature and controlled cooling in an interlock minimizes thermal stresses and crystal lattice devitrification of the deposited epitaxial layer and underlying substrate. Decreased cycle times are an additional benefit derived from isolating the reaction chamber from the wafer handling area.

Moreover, inter-cycle etching of both the susceptor and reaction chamber has been found to equalize the reaction environment to which each wafer is exposed. Greater deposition uniformity, both wafer to wafer and across each wafer, has been found when deposition is carried our according to the present invention. Furthermore, substantial reductions in cycle time, gas usage and power usage have been achieved by the present process.

A preferred embodiment of the present process is illustrated in the accompanying FIG. 1. It will be understood by those skilled in the art that the process profiles illustrated by the preferred embodiment are exemplary in nature, and are not intended to be, nor should they be construed to be, limiting of the scope of the present invention. Rather, it is the sequence of steps in the process which provides, in significant part, the advantages of the present process over known epi processes. In FIG. 1, temperature 10, $H_2$ flow 20 and HCl flow 25 are depicted according to the designations set forth in FIG. 1.

Daily reactor start-up procedures 30 include purging the reactor with nitrogen flowing at 4 slm for fifteen seconds, followed by a nitrogen purge with 30 slm $N_2$ for ninety seconds. The chamber is then purged of nitrogen, by flowing hydrogen into the chamber at 30 slm for a period of ninety seconds. During the hydrogen purge initial rf-heating raises the susceptor temperature from about 50° C. to about 900° C. It has been found, according to the preferred embodiment of the present invention, that initial heating is best achieved by an initial application of power, followed by alternating power reduction and application of gradually diminishing magnitude. By fluctuating power usage during the initial heating of the reactor, a more uniform temperature gradient is established in the reaction chamber and susceptor.

After reactor start-up 30 is complete, the reactor is run in it auto-loop mode 40, which continuously cycles wafers through the deposition process until the daily run is complete.

A wafer, which has been preferably been pre-loaded into the interlock disclosed in the co-pending application R. Crabb et al, Ser. No. 108,771, is loaded onto the susceptor at 900° C. After a hydrogen purge at 30 slm for fifteen seconds, the wafer and susceptor are exposed to a forty-five second heat ramp which increases their temperature from 900° C. to 1190° C. Again, a uniform temperature increase is achieved by fluctuating power to the rf coils. A sixty second hydrogen bake under 20 slm hydrogen is employed, after which the wafer is etched with HCl for a period of thirty seconds to eliminate semiconductor oxides from the wafer surface.

After wafer etching, the chamber is purged with hydrogen while power is reduced to lower the temperature of the susceptor and wafer from 1190° C. to 1135° C. in thirty seconds. With the HCl gas flow continuing, $SiHCl_3$ is introduced into the reactor at a rate of about 12–20 gm/min. Single crystal epitaxial growth proceeds at a rate of about 5.0 /min. Epi growth is conducted for a period of time until thickness is at specification. Experimental testing conducted epi growth for two minutes which grew 10 of single crystal silicon.

The deposition reaction is halted by purging the reaction chamber with hydrogen for twenty-seconds and the wafer and susceptor are cooled from 1130° C. to 900° C. in a hydrogen atmosphere for forty seconds. When the wafer has reached 900° c. it is removed from the susceptor and unloaded from the reaction chamber to the interlock. After the wafer is unloaded from the reaction chamber, the chamber is sealed thereby isolating the reaction chamber from the wafer handling area. After the wafer is unloaded from the reaction chamber, the chamber is purged with hydrogen, to which a high flow of an etchant gas, such as HCl, is added at about 20 slm, to the hydrogen carrier flow for a susceptor etch. After the susceptor etch, a dilution/flow ramp is established whereby the HCl flow is continued and hydrogen flow is increased from 20 slm to 100 slm over twenty seconds to etch the reactor chamber of accumulated residues. After cleaning the susceptor and reactor, the reactor is purged with hydrogen at 100 slm.

The final hydrogen purge at 100 slm is the final step of the run cycle and prepares the reactor for a subsequent deposition run and the repetition of auto loop 40. Epitaxial deposition of silicon carried out in accordance with the present invention offers greater thickness and resistivity uniformity. The following example is for illustrative purposes, and is not intended to limit the present invention.

In the processing of over 2,000 150 mm wafers in accordance with the inventive process and in the epitaxial reactors disclosed in the co-pending patent applications by R. Crabb et al, Ser. No. 108,771, and Albert Ozias, Ser. No. 065,945, as heretofore described, substantial uniformity of the crystal lattice has been achieved. In particular, P+ substrates were 100% slip free, while N+ substrates were mostly slip free with slip lines restricted to an outer 3 mm exclusionary zone on the substrate.

The efficacy of the inventive process, and in particular the high-temperature wafer handling and inter-cycle etching, was examined with reference to run-to-run uniformity and uniformity across the wafer surface. Run-to-run uniformity was examined by comparing thickness variations on a run-to-run basis. Fifty runs were examined and thickness variations were limited to between about ±0.9% to ±1.6% over the entire fifty runs. Resistivity and thickness variations from a single run was also measured. Resistivity was measured at varying distances from the center of the wafer and varied by no more than ±1.5%. Similarly, thickness variations across the wafer surface were also measured at varying distances from the center of the wafer and wafer thickness varied by no more than ±1.4%.

When the dual-height reaction chamber disclosed in the co-pending patent application by Albert Ozias, Ser. No. 065,945, was used with the present process, depletion of the reactants from the reactant gas flow was maintained at about 20% across the wafer surface with increase growth rates. Thus, reactant depletion was kept within that achieved by conventional reactors, but with increased epitaxial growth rates. Furthermore, a significant reduction in wall deposits was noted, thereby rendering inter-cycle etchings feasible. It will be appreciated, by those skilled in the art, that the increased epitaxial growth rate, coupled with the high throughput capabilities and maintenance of a constant run-to-run environment, as achieved by the present process, represent an important advancement in the art of epitaxial deposition.

While the invention has been particularly described with reference to the preferred embodiments thereof, it will be understood and appreciated by those skilled in the art that changes in reaction conditions, reactants or materials are contemplated within the scope of the present invention.

We claim:

1. A process for epitaxial deposition of a semiconductor material onto a substrate, comprising the steps of:
    loading the substrate onto a susceptor in a deposition reactor reaction chamber at an elevated temperature;
    purging the deposition reactor of ambient gases while simultaneously heating the deposition reactor to a temperature greater than deposition temperature;
    etching the substrate with an etchant gas to remove impurities from its exposed surface;
    purging the deposition reactor of said etchant gas while simultaneously reducing the temperature of the deposition reactor to deposition temperature;
    flowing a gaseous stream of a reactant semiconductor species into the deposition reactor, thereby depositing said reactant semiconductor species onto said exposed surface of said semiconductor wafer;
    purging the deposition reactor of ambient gases while cooling the deposition reactor to said elevated temperature; and
    unloading the semiconductor wafer having said reactant semiconductor species deposited thereupon.

2. The process according to claim 1, wherein said step of loading the substrate, further comprises the step of loading the substrate onto a pre-heated susceptor in the deposition reactor at a temperature in the range of about 600° C. to about 1000° C.

3. The process according to claim 1, wherein said step of purging the deposition reactor of ambient gases while heating the deposition reactor further comprises the step of heating the susceptor and deposition reactor to a temperature in the range of about 1150° C. to about 1200° C.

4. The process according to claim 1, wherein said step of etching the substrate further comprises the step of flowing HCl doped hydrogen gas across the substrate at a rate of about 60 to about 100 standard liters per minute.

5. The process according to claim 4, wherein said step of etching the substrate further comprises the step of providing hydrogen gas having about 0.3 to about 1.5 volume percent HCl doped therein.

6. The process according to claim 1, wherein said step of purging the deposition reactor of said etchant gas further comprises the steps of purging the deposition reactor with hydrogen gas and reducing the temperature of the susceptor and deposition reactor to about 1135° C.

7. The process according to claim 1, wherein said step of flowing a gaseous stream of a reactant semiconductor species into the deposition reactor further comprises the step of flowing $SiHCl_3$ into the deposition reactor and across the substrate surface.

8. The process according to claim 7, wherein said step of flowing $SiHCl_3$ into the deposition reactor further comprises the step of flowing $SiHCl_3$ into the deposition reactor at a rate of about 12 to about 20 gm/minute.

9. The process according to claim 1, further comprising the steps of:
    sealing the deposition reactor chamber from a wafer handling area of the deposition reactor;
    flowing an etchant gas into the deposition reactor chamber in a carrier gas while heating the deposition reactor to a temperature greater than deposition temperature;
    etching said susceptor and said deposition reactor with said etchant gas to remove substantially all reactant semiconductor species deposited thereupon; and purging the deposition reactor of ambient etchant gas while simultaneously cooling the susceptor and deposition reaction chamber to said elevated temperature, thereby preparing the deposition reactor for a subsequent deposition run.

10. The process accoring to claim 9, wherein said step of flowing an etchant gas reactor further comprises the step of flowing HCl doped hydrogen gas into the deposition reactor at a rate of about 20 standard liters per minute.

11. The process according to claim 10, wherein said step of etching said susceptor and the deposition reactor further comprises the step of providing hydrogen gas having about 0.3 to about 1.5 volume percent HCl doped therein.

12. The process according to claim 9, wherein said step of flowing an etchant gas further comprises the steps of etching said susceptor with HCl doped hydrogen gas flowing at about 20 standard liters per minute and, thereafter, increasing the flow of HCl doped hydrogen gas to about 100 standard liters per minute to etch the deposition reactor.

13. A process for epitaxial deposition of a semiconductor material onto a semiconductor wafer, comprising the steps of:

loading the semiconductor wafer onto a susceptor in a deposition reactor at an elevated temperature in the range of 600° C. to about 1000° C.;

purging the deposition reactor with hydrogen while simultaneously heating the deposition reactor to a temperature in the range of about 1150° C. to about 1250° C.;

etching the semiconductor wafer with HCl doped hydrogen gas to remove impurities from its exposed surface;

purging the deposition reactor of said etchant gas while simultaneously reducing the temperature of the deposition reactor to deposition temperature;

flowing a gaseous stream of a reactant semiconductor species into the deposition reactor, thereby depositing said reactant semiconductor species onto said exposed surface of said semiconductor wafer;

cooling the deposition reactor to said elevated temperature and unloading the semiconductor wafer having said reactant semiconductor species deposited thereupon;

purging the deposition reactor with hydrogen while simultaneously heating the deposition reactor to a temperature in the range of about 1150° C. to about 1250° C.;

etching said susceptor and said deposition reactor with HCl-doped hydrogen gas to remove substantially all reactant semiconductor species deposited thereupon; and purging the deposition reactor of ambient etchant gas while simultaneously cooling the susceptor and deposition reactor to said elevated temperature, thereby preparing the deposition reactor for a subsequent deposition run.

14. The process according to claim 13, wherein said step of etching the substrate further comprises the step of flowing HCl doped hydrogen gas across the substrate at a rate of about 60 to about 100 standard liters per minute.

15. The process according to claim 14, wherein said step of etching the substrate further comprises the step of providing hydrogen gas having about 0.3 to about 1.5 volume percent HCl doped therein.

16. The process according to claim 13, wherein said step of purging the deposition reactor of said etchant gas further comprises the steps of purging the deposition reactor with hydrogen gas and reducing the temperature of the susceptor and deposition reactor to about 1135° C.

17. The process according to claim 13, wherein said step of flowing a gaseous stream of a reactant semiconductor species into the deposition reactor further comprises the step of flowing $SiHCl_3$ into the deposition reactor and across the substrate surface.

18. The process according to claim 17, wherein said step of flowing $SiHCl_3$ into the deposition reactor further comprises the step of flowing $SiHCl_3$ into the deposition reactor at a rate of about 12 to about 20 gm/minute.

19. The process according to claim 13, wherein said step of etching said susceptor and said deposition reactor further comprises the step of flowing HCl doped hydrogen gas into the deposition reactor at a rate of about 20 standard liters per minute.

20. The process according to claim 19, wherein said step of etching said susceptor and deposition reactor further comprises the step of providing hydrogen gas having about 0.3 to about 1.5 volume percent HCl doped therein.

21. The process according to claim 13, wherein said step of etching said susceptor and said deposition reactor further comprises the steps of etching said receptor with HCl doped hydrogen gas flowing at about 20 standard liters per minute and, thereafter, increasing the flow of HCl doped hydrogen gas to about 100 standard liters per minute to etch the deposition reactor.

* * * * *